United States Patent [19]

Sciulli et al.

[11] 4,139,911
[45] Feb. 13, 1979

[54] HIGH SPEED SENSE CIRCUIT FOR SEMICONDUCTOR MEMORIES

[75] Inventors: Felice M. Sciulli, Dormont, Pa.; David W. Williams, Baltimore, Md.

[73] Assignee: Westinghouse Electric Corp., Pittsburgh, Pa.

[21] Appl. No.: 886,027

[22] Filed: Mar. 13, 1978

[51] Int. Cl.² .................................. G11C 11/40
[52] U.S. Cl. ................. 365/207; 365/184; 365/189; 307/238
[58] Field of Search ............... 365/189, 184, 202, 207

[56] References Cited

U.S. PATENT DOCUMENTS 3,969,706  7/1976  Proebsting .................. 365/207

Primary Examiner—Terrell W. Fears
Attorney, Agent, or Firm—R. M. Trepp

[57] ABSTRACT

A high speed sensing circuit is described incorporating a number of field effect transistors for sensing, amplifying and storing a signal indicative of the polarity of the difference voltage across two load elements. The load elements may be a pair of variable threshold transistors.

2 Claims, 4 Drawing Figures

HIGH SPEED SENSE CIRCUIT FOR SEMICONDUCTOR MEMORIES

GOVERNMENT CONTRACT

The invention herein described was made in the course of or under a contract or subcontract thereunder with the department of the Air Force.

CROSS-REFERENCE TO A RELATED APPLICATION

This application is cross-referenced to Ser. No. 885,821, filed 3-13-78, in the name of D. W. Williams, which discloses a CMOS memory sense circuit for comparing a first and second voltage.

BACKGROUND OF THE INVENTION

1. Field of the Invention

This invention relates to semiconductor memory sense circuits particularly to variable threshold transistor memory sense circuits.

2. Description of the Prior Art

A semiconductor memory includes a plurality of memory cells which are normally arranged in an array having rows and columns which are orthogonal to one another. A memory cell may contain one or two variable threshold transistors such as a metal nitride oxide semiconductor (MNOS) transistor. Information is written into and read out of the memory array by selecting the row and column pertaining to the desired memory cell with a row decoder and column decoder. To write information into a memory cell, voltages are placed across the variable threshold transistor to shift the threshold voltage of the transistor, for example, to a threshold voltage of $-2$ volts and $=8$ volts. The threshold voltage of the transistor or pair of transistors is read out by placing a predetermined voltage on the selected row of the memory cell which is coupled to the gates of the variable threshold transistors in the row. The voltage is normally selected to cause the variable threshold transistor to turn on or source follow if its threshold voltage is $-2$ volts and to remain off or to conduct a very small amount of current in the microamperes, if the threshold voltage is at $-8$ volts.

In the prior art, the current passing through the variable threshold transistor between the source and drain electrodes is detected or sensed by comparing it with the current passing through a reference load or through another variable threshold transistor which has a predetermined threshold voltage. The sense circuit normally used to compare the conductivities of two load elements is a cross-coupled latch which is initially set so that neither transistor in the latch conducts current. For example, a cross-coupled latch consisting of two P-channel enhancement load, field effect transistors initially has its source, drain and gate electrodes charged to the same voltage. At the appropriate time for sensing, the gate of the first transistor and the drain of the second transistor are coupled to one load element while the gate of the second transistor and the drain of the first are coupled to a second load element. As the two load elements conduct current, the gates of the two transistors drop in voltage from their precharged potential. The load element having the greatest conductivity will pull its gate of the first transistor, for example, to a lower potential first resulting in turning on the first transistor first which supplies current to its drain and the other load element tending to pull the voltage at the other load element positive. Since the gate of the second transistor is coupled to the drain of the first transistor, the gate is pulled positive tending to turn the second transistor off. The gate of the first transistor continues to drop in potential while the gate of the second transistor is charged up causing the cross-coupled pair of field effect transistors to latch in a stable state.

In a bi-stable or cross-coupled sense latch, no latching occurs until the voltage has dropped on one of the gates of the transistors in the sense latch sufficient to cause one of the transistors to conduct current. In a large array of memory cells, many variable threshold transistors are coupled together such as by their source electrodes in a column before coupling through a column decoder to one side of the latch which results in a large capacitance to be discharged by the selected memory cell. The large capacitance on one side of the latch results in longer times for the voltage to drop and hence longer times for the latch to stabilize.

In the cross-coupled latch, the gate to source voltage changes as the variable threshold transistor discharges the voltage on its source; the voltage discharges to the final gate to source voltage of a field effect transistor operating in the source follower mode. The variable threshold transistor utilized in a memory array may be a drain source protected structure wherein a non-memory region in the gate oxide over the drain and source exists with the memory dielectric region in between as described by J. R. Cricchi, F. C. Blaha, and M. D. Fitzpatrick in a paper entitled "The Drain Source Protected MNOS Memory Device And Memory Endurance", at the International Electron Devices Meeting sponsored by the IEEE, 1973. For a memory having the highest density, the minimum size variable threshold transistor geometry is often selected which results in a transistor with unoptimized conduction characteristics.

If a memory cell has two load elements wherein each load element is a variable threshold transistor then the currents drawn by the load elements are $I_{ds1}$ and $I_{ds2}$. The difference in current between the two load elements is $\Delta I_{ds}$. The $\Delta I_{ds}$ is determined by the $\Delta V_{th}$, the difference in threshold voltage. Ideally, a uniform parallel conductance shift should occur at all current values. This would make the current sensing independent of the non-memory portions of the memory transistor since it would be modulated solely by the change in $V_{th}$, threshold voltage, in the memory region. This is desirable since variable threshold transistors in certain memories operate at larger current values during read operation. The final source voltage, $V_s$, is never reached since charging or discharging of the latched transistors to their threshold voltage, $V_{th}$, occurs first. Therefore, care was taken to utilize optimized devices which produce a uniform (parallel) conductance shift. If a parallel or uniform conductance shift is not achieved, even though the differential write cell is written to a $\Delta V_{th}$ state, improper detection can occur due to the small $\Delta I_{ds}$ source follower charging currents. The $\Delta I_{ds}$ source follower charging currents can be below the sensitivity of the sense latch. For optimized conductance characteristics it has been shown experimentally that $\Delta V_{th}$ of the variable threshold transistors in a memory cell must be greater than 0.5 volts to insure correct detection by a cross-coupled sense latch. Larger $\Delta V_{th}$ requires longer write times to shift the threshold voltage of each variable threshold transistor which is undesirable.

It is therefore desirable to provide a sense circuit which will detect the threshold state of a variable threshold transistor without requiring the capacitance associated with a column of variable threshold transistors to be discharged.

It is further desirable to provide an improved sense circuit which will detect smaller $\Delta V_{th}$ between two variable threshold transistors to require less writing time.

It is further desirable to provide a sense amplifier which will operate adequately without the need to optimize the geometry of the drain source protected memory device for the sense circuit.

SUMMARY OF THE INVENTION

In accordance with the present invention, a memory sense circuit is described for comparing the threshold voltages of a first and second variable threshold transistor wherein the drain electrodes of the first and second variable threshold transistors are coupled to a first voltage supply and the gate electrodes are coupled to a second voltage supply comprising: third and fourth field effect transistors, each having a gate, source and drain electrode, the gate electrode of the third transistor coupled to the drain electrode of the fourth transistor and the source electrode of the first variable threshold transistor, the gate electrode of the fourth transistor coupled to the drain electrode of the third transistor and the source electrode of the second variable threshold transistor, first and second control signals, first means coupled to and responsive to the first control signal for coupling the source electrode of the third and fourth transistors to a third voltage supply, second means coupled to and responsive to the second control signal for coupling the drain and source electrodes of the third transistor together to place the voltage of the source electrode of the second variable threshold transistor onto the source electrode of the third transistor, and third means coupled to and responsive to the second control signal for coupling the drain and source electrodes of the fourth transistor together to place the voltage on the source electrode of the first variable threshold transistor onto the source electrode of the fourth transistor.

DESCRIPTION OF THE PREFERRED EMBODIMENTS

Figure 1:
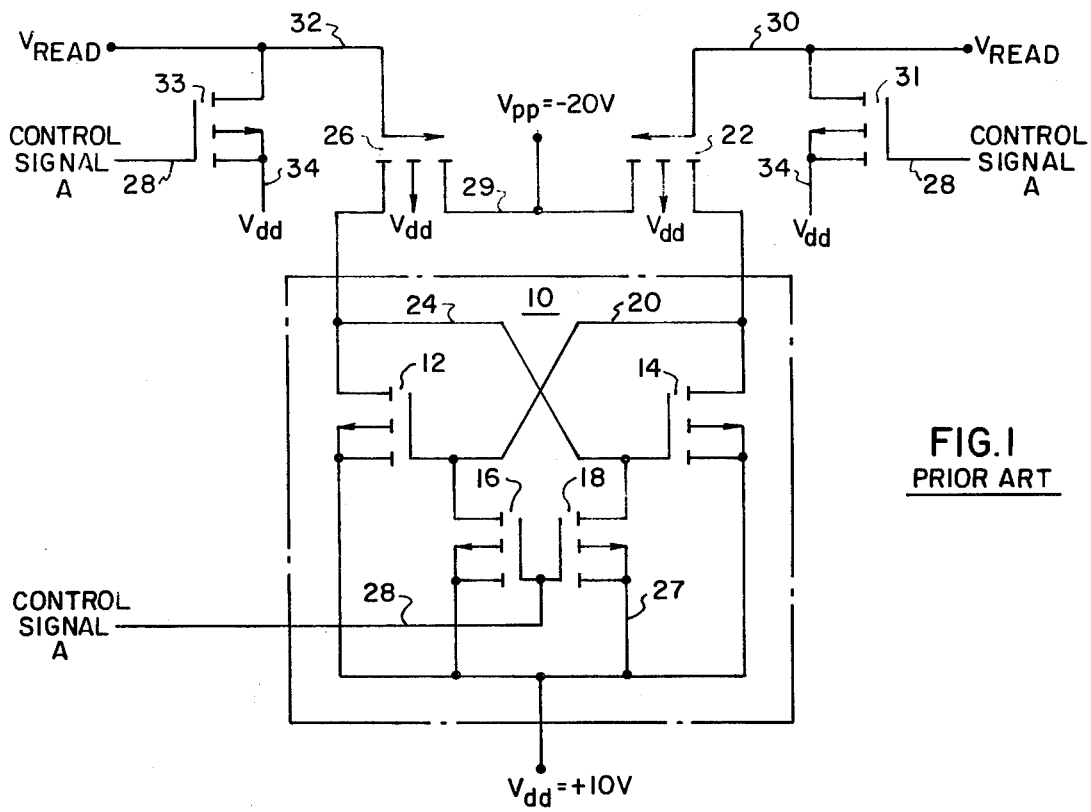
FIG. 1 is a circuit schematic of a prior art memory sense circuit.

Referring to FIG. 1, a circuit schematic of a prior art memory sense circuit is shown. Memory sense circuit 10 comprises P-channel enhancement mode transistors 12, 14, 16 and 18. The gate of transistor 12 is coupled over line 20 to the drain of transistor 14, the drain of transistor 16 and the source of transistor 22. The gate of transistor 14 is coupled over line 24 to the drain of transistor 12, the drain of transistor 18 and the source of transistor 26. Transistors 22 and 26 are variable threshold transistors. The source of transistors 12, 14, 16 and 18 are coupled over line 27 to voltage $V_{dd}$ which may for example be 10 volts. The gate of transistors 16 and 18 are coupled over line 28 to control signal A. The control signal A functions to cause transistors 16 and 18 to be conducting which in turn couples voltages supply $V_{dd}$ to lines 20 and 24 holding them at +10 volts until control signal A goes high causing the transistors 16 and 18 to be non-conducting which disconnects voltage supply $V_{dd}$ from lines 20 and 24. Lines 20 and 24 are coupled to the source electrode of memory transistors 22 and 26 respectively. The drains of transistors 22 and 26 are coupled over line 29 to voltage supply $V_{pp}$ which may for example be −20 volts. The gate of transistor 22 is coupled over line 30 to the drain of transistor 31 and to a voltage for reading transistor 22, $V_{read}$. The gate of transistor 26 is coupled over line 32 to the drain of the transistor 33 and to a voltage suitable for reading transistor 26, $V_{read}$. The gate of transistors 31 and 33 are coupled over line 28 to control signal A. The source electrode of transistors 31 and 33 are coupled over line 34 to voltage supply $V_{dd}$.

In operation control signal A goes low causing transistors 31, 33, 16 and 18 to be conducting which causes lines 30 and 32 to be pulled to the voltage of $V_{dd}$ such as +10 volts causing memory transistors 22 and 26 to be non-conducting. It is understood that the read voltage $V_{read}$ does not clamp lines 32 and 30 when transistors 31 and 33 are conducting and allows lines 30 and 32 to be pulled to +10 volts. Control signal A also pulls lines 20 and 24 to +10 volts through transistors 16 and 18. When control signal A goes from a low state such as 0 volts to a high state such as 10 volts, transistors 31 and 33 are non-conducting allowing lines 30 and 32 to go to the read voltage $V_{read}$ which is a normally a voltage between the two threshold voltages that variable threshold transistors 22 and 26 may assume. Control signal A also causes transistor 16 and 18 to be non-conducting which isolates lines 20 and 24 from voltage supply $V_{dd}$. Memory transistor 22 may for example be written with a threshold voltage of −8 volts while memory transistor 26 may be written with a threshold voltage of −2 volts. The −2 and −8 threshold voltage represents the two threshold states of the memory transistors 22 and 26. If the voltage $V_{read}$ goes to −5 volts which is midway between −2 and −8 volts, memory transistor 26 will be conducting while memory transistor 22 will be non-conducting. The current drawn by memory transistor 26 will pull line 24 towards −20 volts causing transistor 14 to be conducting which tends to couple line 20 to voltage supply $V_{dd}$ or +10 volts. Transistor 12 will be non-conducting isolating line 24 from voltage supply $V_{dd}$. Transistors 12 and 14 function as a latch and remain in stable condition with line 24 pulled to −20 volts and line 20 pulled to +10 volts. Even if memory transistor 22 conducts some current, once the latch is set the current through transistor 14 is sufficient to keep line 20 at +10 volts. The setting of the latch comprising transistors 12 and 14 is determined by the discharge of lines 24 and 20 through transistors 22 and 26. The memory transistor with the highest conductivity will therefore discharge its source the fastest causing the latch to set by causing either transistors 12 or 14 to be conductive first.

Figure 2:
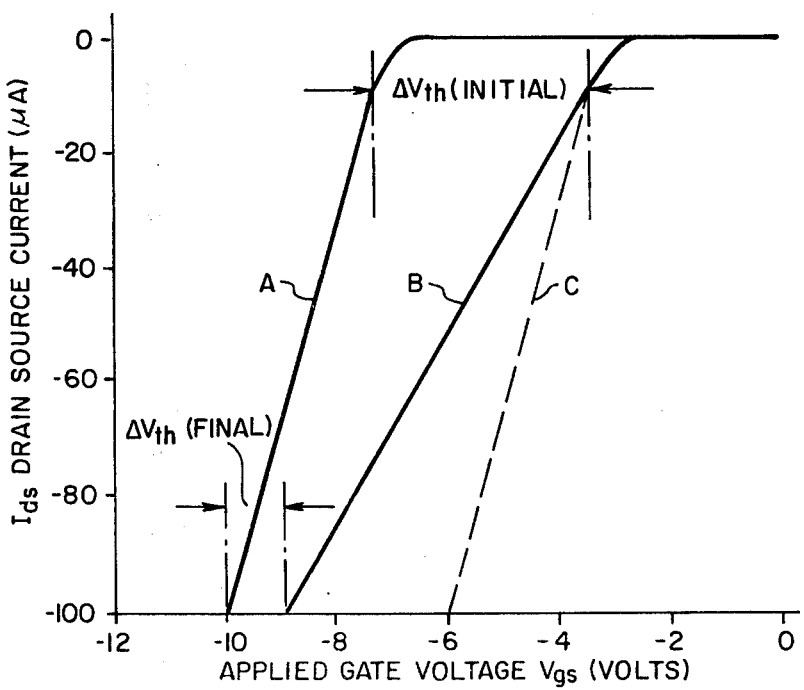
FIG. 2 shows gate voltage versus drain source current characteristics in curves A and B for two typical variable threshold transistors, each having a different threshold voltage, $V_{th}$.

FIG. 2 shows a graph of gate voltage $V_{gs}$ versus drain source current, $I_{ds}$ for two typical variable threshold transistors each having a different threshold voltage $V_{th}$ as shown by curves A and B. In FIG. 2 the ordinate represents drain source current, $I_{ds}$ in microamperes and the abscissa represents applied gate voltage, $V_{gs}$ in volts.

Curve A represents the measured characteristics of a memory transistor having unoptimized geometry and having its threshold voltage, $V_{th}$ shifted to the low conductance state such as $-7$ volts. Curve B represents the measured characteristics of a memory transistor having unoptimized geometry and having its threshold voltage, $V_{th}$ shifted to the high conductance state such as $-3$ volts. Curve C represents the desired characteristics for a memory transistor having optimized geometry having its threshold voltage, $V_{th}$ shifted to the high conductance state such as $-3$ volts. Since memory sense circuit 10 in FIG. 1 depends upon the discharge current, $I_{ds}$, of the two memory transistors 22 and 26, there must be a $\Delta I_{ds}$ between transistors 22 and 26 during discharge of lines 20 and 24. $\Delta I_{ds}$ is determined by the difference in threshold voltage, $\Delta V_{th}$. Ideally, a uniform parallel conductance shift or spread in threshold voltage, $V_{th}$ should occur at all current values, $I_{ds}$ at the time discharging occurs. This would make the current sensing by memory sense circuit 10 independent of the unoptimized geometry of the memory transistor. An example of a memory transistor having unoptimized geometry is described by J. R. Cricchi, F. C. Blaha, and M. D. Fitzpatrick, in a paper entitled "The Drain Source Protected MNOS Memory Device and Memory Endurance", presented at the International Electron Device Meeting, 1973 which is sponsored by the IEEE. In this memory structure there is a non-memory region over the drain and source with the memory region in between. An example of a drain source protected memory device is contained in U.S. Pat. No. 3,719,866 issued Mar. 6, 1973 to Charles T. Naber et al. The unoptimized memory devices do not exhibit uniform (parallel) conductance shift as shown by curves A and C in FIG. 2. Improper detection of the polarity of a pair of variable threshold transistors of the threshold voltages can occur with the memory sense circuit shown in FIG. 1 due to small $\Delta I_{ds}$ source follower charging currents which is below the sensitivity of the memory sense circuit.

Figure 3:
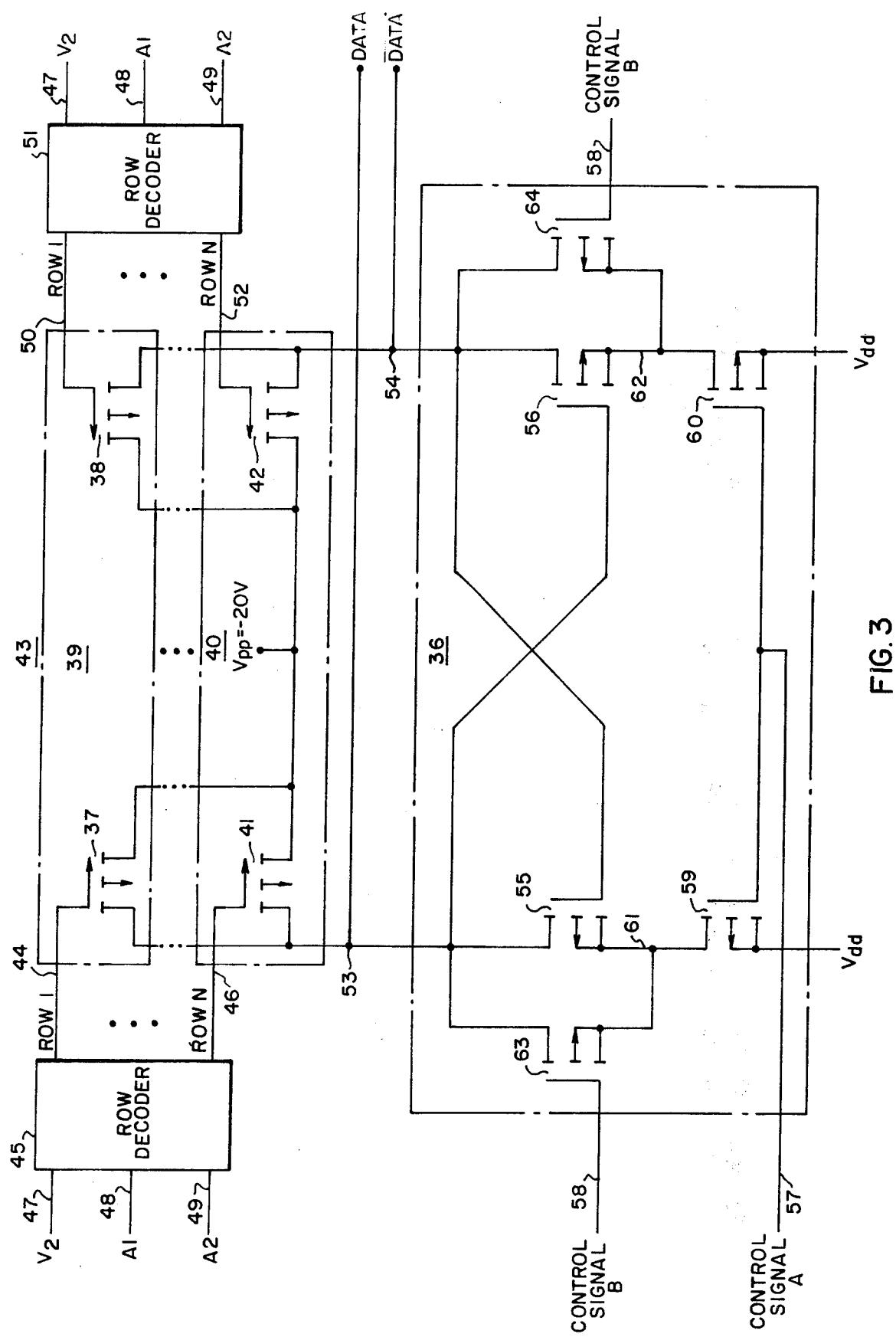
FIG. 3 is a circuit schematic of one embodiment of the invention.

In FIG. 3 a circuit schematic of one embodiment of the invention is shown. Memory sense circuit 36 functions to compare the threshold voltage of a first and second variable threshold transistor such as variable threshold transistors 37 and 38. Transistors 37 and 38 form a memory cell 39. A number of memory cells may be stacked in a column where memory cell 40 may be the end memory cell in a column and consists of memory transistors 41 and 42. A column of memory cells such as memory cells 39 through an end memory cell 40 may be considered to be an array of memory cells 43. It is understood that several columns of memory cells such as memory cell 39 through the end memory cell may be combined in parallel to form a plurality of columns with the memory cells in a particular column forming a plurality of rows.

The drain electrodes of transistors 37, 38, 41 and 42 are coupled to a first voltage supply $V_{pp}$ which may for example equal $-20$ volts. The gate of transistor 37 is coupled over line 44 to an output of row decoder 45. The gate of transistor 41 is coupled over line 46 to an output of row decoder 45. A second voltage supply $V_2$ is coupled to an input of row decoder 45. Address signals for selecting a row of memory array 43 such as A1 and A2 are coupled over lines 48 and 49 to row decoder 45. Row decoder 45 functions to select a row such as row 1 to N in response to the address signals at the input of row decoder 45. During read operation, row decoder 45 places second voltage supply $V_2$ on the selected row line which may for example be line 44. The gate of transistor 38 is coupled over line 50 to an output of row decoder 51. The gate of transistor 42 is coupled over line 52 to an output of row decoder 51. Row decoder 51 may have input address lines such as A1 and A2 on lines 48 and 49, respectively. A second voltage supply $V_2$ may be coupled over line 47 to an input of row decoder 51. Row decoder 51 functions similarly to row decoder 45 in that it selects a row line in response to the address signals at its input to select the same row as selected by the same addresses by row decoder 45. In operation row decoders 45 and 51 select the same memory cell but different memory transistors in the memory cell in response to a particular address. During read operation the selected row line of row decoder 51 is brought to the voltage of the second power supply $V_2$. The nonselected row lines remain at $+10$ volts or $V_{dd}$. Row decoder 51 has output row lines 1 through N for selecting a row of memory cells in response to the address signals. The source electrode of transistors 37 and 41 are coupled over line 53 to an input of memory sense circuit 36. The source electrodes of transistors 38 and 42 are coupled over line 54 to an input of memory sense circuit 36.

Within memory sense circuit 36 transistor 55 has its drain coupled over line 53 to the gate of transistor 56. Transistor 56 has its drain coupled over line 54 to the gate of transistor 55. A first control signal A is coupled over line 57 to a control input of memory sense circuit 36 and a second control signal B is coupled over line 58 to a control input of memory sense circuit 36. A first means is coupled to and responsive to the first control signal A such as transistors 59 and 60 for coupling the source electrode of transistor 55 and 56 to a third voltage supply $V_{dd}$ which may for example be 10 volts. As shown in FIG. 3 first control signal A is coupled over line 57 of the gate of transistors 59 and 60. The source of transistor 55 is coupled to the drain of transistor 59 over line 61. The source of transistor 56 is coupled to the drain of transistor 60 over line 62. The source of transistor 59 and 60 are coupled to third voltage supply $V_{dd}$.

A second means is coupled and responsive to the second control signal B such as transistor 63 for coupling the drain and source electrodes of transistor 55 together to place the voltage of the source electrode of the selected memory transistor such as transistor 37 onto the source electrode of 55. As shown in FIG. 3, second control signal B is coupled over line 58 to the gate of transistor 63. The drain of transistor 63 is coupled over line 53 to the drain of transistor 55. The source electrode of transistor 63 is coupled over line 61 to the source electrode of transistor 55. When second control signal B goes low such as $-20$ volts, transistor 63 will conduct causing its drain and source and the drain and source of transistor 55 to be coupled together without a voltage drop.

A third means such as transistor 64 is coupled and responsive to the second control signal B for coupling the drain and source electrodes of transistor 56 together to place the voltage on the source electrode of the selected memory transistor such as memory transistor 38 onto the source electrode of transistor 56. Second control signal B is coupled over line 58 to the gate of transistor 64. The drain of transistor 64 is coupled over line 54 to the drain of transistor 56. The source of transistor 64 is coupled over line 62 to the source of transistor 56. When signal B goes low such as $-20$ volts, transistor 64 will be conducting causing its drain and source electrode and the drain and source electrode of transistor 56 to be coupled together without a voltage drop. As shown in FIG. 3, transistors 55, 56, 59, 60, 63 and 64 are P-channel enhancement mode fixed threshold field effect transistors. The transistors are fixed threshold in that the signal levels in memory sense circuit 36 are insufficient to shift the threshold voltage of the transistors. Fixed threshold transistors have a thick oxide region underneath the gate where variable threshold transistors normally have a thin oxide region underneath the gate such as 20 angstroms as compared to 750 angstroms. It is understood that the transistors and memory sense circuit 36 may be N channel enhancement mode transistors with suitable adjustment for the voltages of control signals and power supply voltages which is well known in the art.

Figure 4:
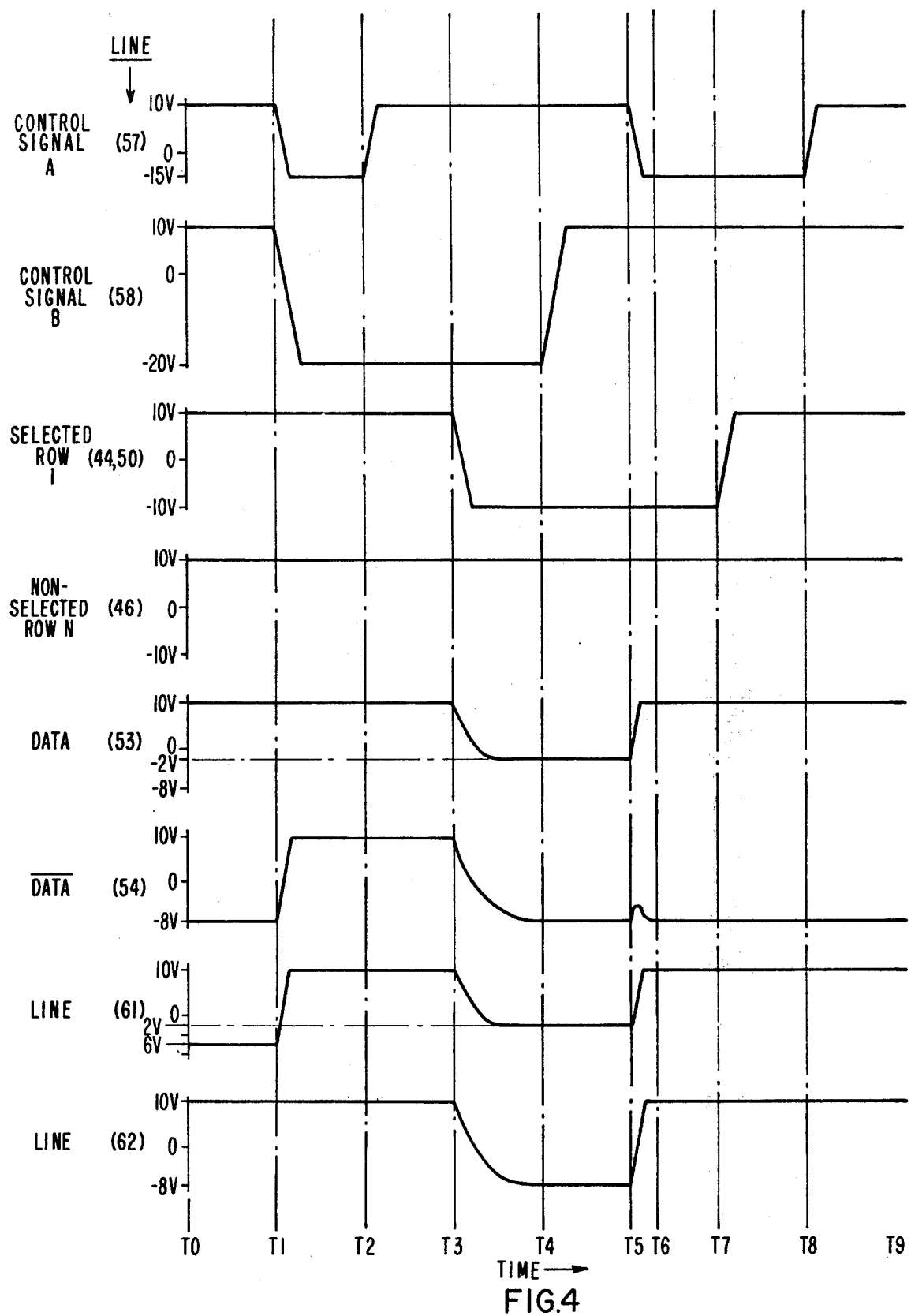
FIG. 4 shows circuit wave forms for the operation of the embodiment of the invention shown in FIG. 3.

The operation of memory sense circuit 36 as shown in FIG. 3 may be understood by reference to FIG. 4 which shows circuit waveforms for reading data from a selected memory cell in memory array 43. In FIG. 4, the ordinant for each waveform represents voltage and the abscissa represents time. The operation of memory sense circuit 36 for reading memory cell 37 where transistor 37 has a threshold voltage of $-8$ volts and transistor 38 has a threshold of $-2$ volts is described as follows. At time T0 as shown in FIG. 4 control signal A on line 57 and control signal B on line 58 is higher at 10 volts. Selected row 1 and non-selected row N are high at 10 volts. Signal Data on line 53 is floating and may be for example $+10$ volts. Signal Data is floating and may be $-8$ volts. Line 61 may be at $-6$ volts. Line 62 may be at $+10$ volts and floating. At time T1 control signal A on line 57 goes from 10 volts to $-15$ volts and control signal B on line 58 goes from 10 volts to $-20$ volts. Control signal A causes transistors 59 and 60 to be conducting which couples third voltage supply, $V_{dd}$ to lines 61 and 62 and charges them up to the voltage of $V_{dd}$ which may be for example $+10$ volts. Control signal B on line 58 causes transistors 63 and 64 to conduct coupling line 61 to line 52 or the source of transistor 55 to its drain and coupling line 62 to line 54 or the source of transistor 56 to its drain. Lines 53 and 54 are therefore precharged to be the voltage of line 61 and 62 or to the voltage of third power supply $V_{dd}$, 10 volts as shown in FIG. 4. At time T2 control signal A goes from $-15$ volts to 10 volts causing transistors 59 and 60 to be non-conducting isolating third voltage supply $V_{dd}$ from lines 61 and 62. Selected row 1 and non-selected row N remain at $+10$ volts by action of row decoder 45 and 51. At time T3 row decoders 45 and 51 in response to the address signals on its input select one output row, row 1 to go from 10 volts to $-10$ volts while holding all the other output rows of the row decoder at $+10$ volts. With the gate electrode of transistors 37 and 38 at $-10$ volts and the source electrode at $+10$ volts, lines 53 and 54 respectively, transistors 37 and 38 will each begin to conduct current $I_{ds}$ to discharge the source electrode voltage towards a final source electrode voltage of $V_2 = V_g - |V_{th} =$ memory. The transistor source voltage, $V_s$ for transistor 37 will appear on lines 53 and 61. The memory source voltage $V_s$ for transistor 38 will appear on lines 54 and 62. The gate bias of transistor 55 is the same as line 54 and the source voltage of transistor 38. The gate bias of transistor 56 is the same as line 53 and the source voltage of transistor 37. It being understood that the source voltage of transistors 37 and 38 are originally at $+10$ volts and that they discharge to a source follower source voltage of $V_s = V_g - |V_{th}|_{memory}$. The gate to source voltage of transistor 55, $V_{gs}$ is equal to $V_{s\ 38} - V_{s\ 37}$. The gate to source voltage of transistor 56, $V_{gs}$ is equal to $V_{s\ 37} - V_{s\ 38}$. The differential bias voltage of the cross-coupled pair of transistors, transistors 55 and 56, is equal to $V_{gs\ 55} - V_{gs\ 56}$, which may be calculated as shown in equation (2) utilizing equation (1).

$$V_s = V_g - |V_{th}|_{memory} \tag{1}$$

$$V_{gs\ 55} - V_{gs\ 56} = [V_{s\ 38} - V_{s\ 37}] - [V_{s\ 37} - V_{s\ 38}] =$$
$$2[V_{s\ 38} - V_{s\ 37}] = 2[\Delta V_{s(38-37)}] \tag{2}$$

Since $V_s = V_g - V_{th\ memory}$ where $V_g$ is identical for transistors 37 and 38, the value of $2\Delta V_s$ corresponds directly to $2\Delta V_{th}$ where $\Delta V_{th}$ is $V_{th\ 37} - V_{th\ 38}$. The differential voltage of $2\Delta V_{th}$ of the cross-coupled pair, equation (2), results from only one $\Delta V_{th}$ difference between memory transistors 37 and 38. The memory sense circuit 36 has a unique feature of doubling the differential threshold voltage of selected memory cell 39.

If the threshold voltage of transistor 37 was shifted to $-8$ volts and the threshold voltage of transistor 38 was shifted to $-2$ volts indicative of a stored binary state of one or zero in memory cell 39. The gate to source bias, $V_{gs}$ of transistor 55 would be $-\Delta V_{th}$ while the gate to source bias of transistor 56, $V_{gs}$ would be $+\Delta V_{th}$. The memory devices are allowed to source follow to their final $V_s$ values of equation (1). During this sampling time the memory source follower action of transistors 37 and 38 is very fast since the effective load capacitance that its source sees is small. The effective load capacitance is small since the gate and source substrate nodes of the cross-coupled pair of transistors 55 and 56 are charged simultaneously. The gate capacitance of transistors 55 and 56 are charged in series with the small junction capacitance of the sources of transistors 55 and 56 lines 61 and 62, respectively, producing a small effective capacitance to the source of transistors 37 and 38. The final source voltage for transistor 37 is $-2$ volts and the final source voltage, $V_s$ for transistor 38 is $-8$ volts as shown on lines 53 and 54, respectively, just prior to time T4.

At time T4, control signal B on line 58 goes from $-20$ to 10 volts causing transistors 63 and 64 to be non-conducting which ends the sampling time and isolates line 53 from line 61 and line 54 from line 62. At T5 control signal A goes from 10 volts to $-15$ volts causing transistors 59 and 60 to be conducting pulling lines 61 and 62 to the voltage of third voltage supply, $V_{dd}$ to 10 volts. As lines 61 and 62 are charged to 10 volts, the gate to source voltage $V_{gs}$ of transistors 55 and 56 increases. The threshold voltage of transistor 55 is reached before the threshold voltage of transistor 56 due to the initial gate to source bias, $V_{gs}$ of transistor 55 compared to transistor 56 provided by the source voltage of transistors 37 and 38 in memory cell 39 during time T3 to T4. As transistor 55 begins to conduct line 53 is charged or pulled up to $+10$ volts causing transistor 56 to be non-conducting. Transistors 55 and 56 are therefore latched at T6 with line 53 at $+10$ volts and line 54 pulled low by the current through the transistor 38 to a final source voltage, $V_s$ $-8$ volts. After transistors 55 and 56 latch which is between T5 and T6 the data is valid on lines 53 and 54 until memory sense circuit 36 is reset such as between T1 and T2. At time T7 row decoder 45 and 51 deselect row 1 and lines 44 and 50 go from −10 volts to +10 volts turning offf transistors 37 and 38.

The data output on lines 53 and 54 are valid from time T6 through T8 when transistors 55 and 56 are in the latched condition.

At time T8 control signal A goes from −15 volts to 10 volts causing transistor 59 and 60 to be non-conducting. After time T8 such as at time T9 lines 53 and 54 are floating as well as lines 61 and 62. At T9, the data on lines 53 and 54 may or may not remain valid. Since the lines are floating, they may be pulled to other voltages such as by leakage currents. At time T9 the operation of reading the data from memory cell 39 is complete with the control signals returned for another read cycle beginning at T0. The data was valid from T6 to T8 from memory sense circuit 36.

The invention provides a memory sense circuit for comparing the threshold voltage of a first and second variable threshold transistor wherein the drain electrodes of the first and second variable threshold transistors are coupled to a first voltage supply and the gate electrodes are coupled to a second voltage supply comprising third and fourth field effect transistors each having a gate, source and drain electrode, the gate electrode of the third transistor coupled to the drain electrode of the fourth transistor and the source electrode of the first variable threshold transistor, the gate electrode of the fourth transistor coupled to drain electrode of the third transistor and the source electrode of the second variable threshold transistor, first and second control signals, first means coupled to and responsive to the first control signal for coupling the source electrode of the third and fourth transistors to a third voltage supply, second means coupled to and responsive to the second control signal for coupling the drain and source electrodes of the third transistor together to place the voltage of the source electrode of the second variable threshold transistor onto the source electrode of the third transistor, and third means coupled to and responsive to the second signal for coupling the drain and source electrodes of the fourth transistor together to place the voltage on the source electrode of the first variable threshold transistor onto the source electrode of the fourth transistor.

What we claim is:

1. A memory sense circuit for comparing the threshold voltages of a first and second variable threshold transistor wherein the drain electrodes of said first and second variable threshold transistors are coupled to a first voltage supply and the gate electrodes are coupled to a second voltage supply comprising:

third and fourth field effect transistors each having a gate, source and drain electrode, the gate electrode of said third transistor coupled to the drain electrode of said fourth transistor and the source electrode of said first variable threshold transistor, the gate electrode of said fourth transistor coupled to the drain electrode of said third transistor and the source electrode of said second variable threshold transistor, first and second control signals, first means coupled to and responsive to said first control signal for coupling the source electrode of said third and fourth transistors to a second voltage supply, second means coupled to and responsive to said second control signal for coupling the drain and source electrodes of said third transistor together to place the voltage of the source electrode of said second variable threshold transistor onto the source electrode of said third transistor, and third means coupled to and responsive to said second control signal for coupling the drain and source electrodes of said fourth transistor together to place the voltage on the source electrode of said first variable threshold transistor onto the source electrode of said fourth transistor, whereby said first control signal is used to reset and latch said sense circuit and said second control signal is used to reset said sense circuit and to sample the voltages on the source electrode of the variable threshold transistors.

2. A memory sense circuit for comparing the threshold voltages of a first and second variable threshold transistor wherein the drain electrodes of said first and second variable threshold transistors are coupled to a first voltage supply and the gate electrodes are coupled to a second voltage supply comprising:

third through eighth field effect transistors each having a gate, source and drain electrode, the gate electrode of said third transistor coupled to the source electrode of said first variable threshold transistor and the drain electrode of said fourth and fifth transistors, the gate electrode of said fifth transistor coupled to the source electrode of said second variable threshold transistor and the drain electrode of said third and sixth transistors, the source electrode of said third transistor coupled to the sorce electrode of said sixth transistor and the drain electrode of said seventh transistor, the source electrode of said fifth transistor coupled to the source electrode of said fourth transistor and the drain electrode of said eighth transistor, the source electrode of said seventh and eighth transistors coupled to a third voltage supply, the gate electrode of said seventh and eighth transistors coupled to a first control signal for controlling the conduction of said seventh and eighth transistors, and the gate electrode of said fourth and sixth transistors coupled to a second control signal for controlling the conduction of said fourth and sixth transistors, whereby said first control signal is used to reset and latch said sense circuit and said second control signal is used to reset said sense circuit and to sample the voltages on the source electrode of the variable threshold transistors.

* * * * *